United States Patent [19]

Engstrom

[11] 4,390,866
[45] Jun. 28, 1983

[54] KEYBOARD WITH ELECTRONIC HYSTERESIS

[75] Inventor: Keith A. Engstrom, Arlington Heights, Ill.

[73] Assignee: Illinois Tool Works Inc., Chicago, Ill.

[21] Appl. No.: 235,374

[22] Filed: Feb. 19, 1981

Related U.S. Application Data

[60] Division of Ser. No. 457,884, Apr. 4, 1974, which is a division of Ser. No. 339,476, Mar. 8, 1973, abandoned, which is a continuation of Ser. No. 144,902, May 19, 1971, abandoned.

[51] Int. Cl.³ .............................................. G11C 19/00
[52] U.S. Cl. ................................ 340/365 E; 340/711; 400/477
[58] Field of Search ............... 340/712, 365 R, 365 E, 340/711; 400/477, 479, 479.1, 479.2

[56] References Cited

U.S. PATENT DOCUMENTS 3,648,117 3/1972 Yamamoto et al. ............ 340/365 E
3,745,536 7/1973 Klehm, Jr. ..................... 340/365 E
3,750,113 7/1973 Cencel ............................. 340/365 C
3,918,051 11/1975 Bernin et al. ................... 340/365 E
4,037,225 7/1977 De Vall ........................... 340/365 E Primary Examiner—Marshall M. Curtis
Attorney, Agent, or Firm—Donald D. Mondul; Thomas W. Buckman

[57] ABSTRACT

A keyboard having a plurality of selectively operable matrix elements, each having an actuated and an unactuated state. The state of each matrix element is sequentially scanned and sensed and temporarily stored in a memory. A level detector is coupled to the matrix elements and to the memory means for comparison of the sensed state to a threshold level and for producing an output representative of each comparison. Feedback circuitry is coupled to the memory means for transmitting a feedback signal representative of the previous scan state of each matrix element. The level detector responds to the feedback signal to vary the relative levels of each of the sensed states and its respective threshold level in response to the previous scan state of the matrix element currently scanned.

18 Claims, 3 Drawing Figures

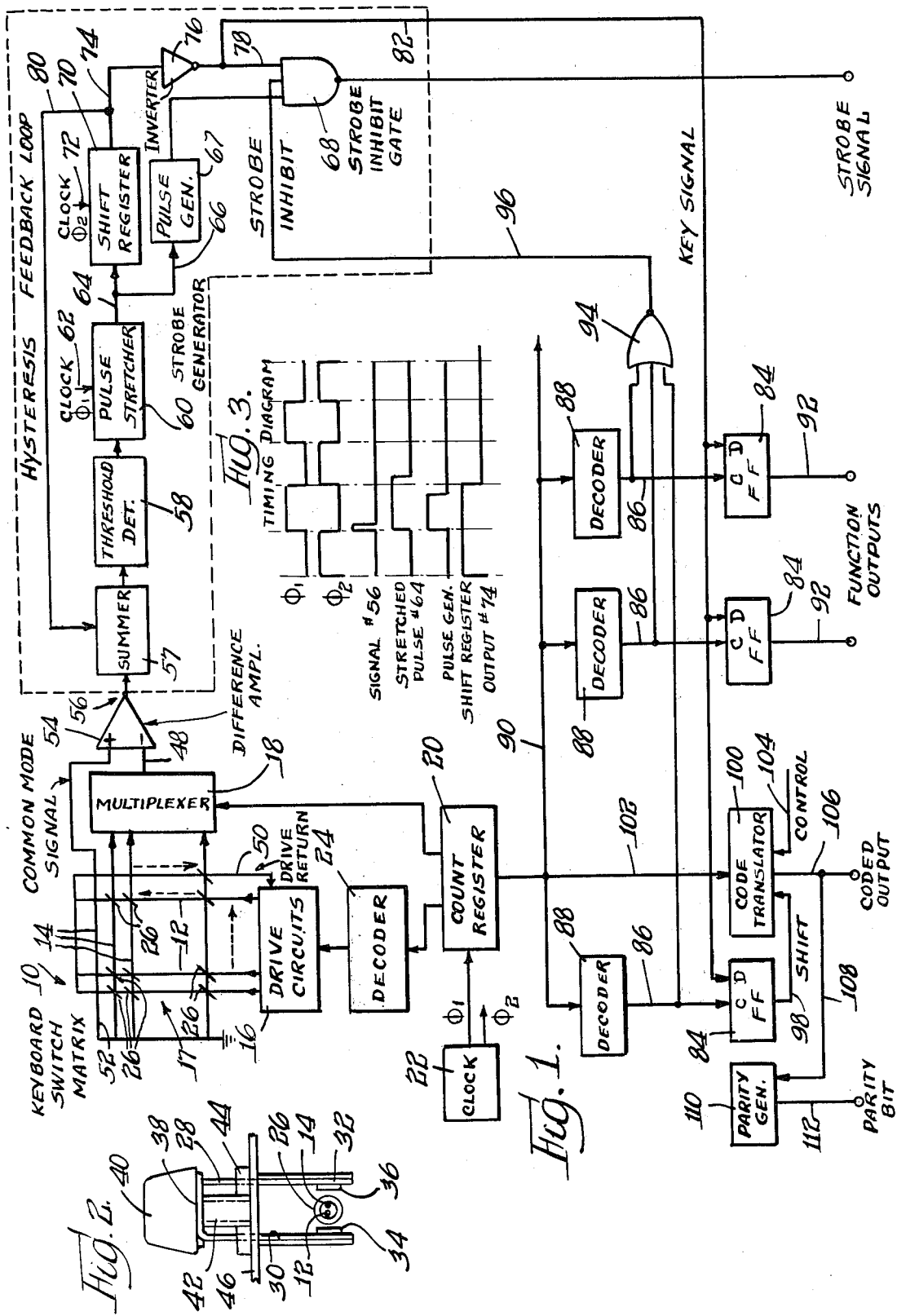

KEYBOARD WITH ELECTRONIC HYSTERESIS

This application is a divisional application of U.S. Pat. application Ser. No. 457,884 filed Apr. 4, 1974, which application was a divisional application of U.S. Pat. application Ser. No. 339,476 filed Mar. 8, 1973, now abandoned, which application was a continuation of U.S. Pat. application Ser. No. 144,902 filed May 19, 1971, now abandoned.

DESCRIPTION OF THE PRIOR ART

Keyboards comprise a well known means for feeding information into data processors. It will be understood that two keys can be depressed substantially simultaneously, and it further will be understood that the two keys should not simultaneously transmit information. Such information can be garbled, resulting in a false code. Heretofore this has been prevented by providing N-Key lockout and 2 Key Rollover, sometimes abbreviated as "NKL/2KR". NKL/2KR is defined for a given set of keys on the keyboard as that property which permits the given key to be transmitted if, and only if, that key is the only key in the set which is depressed (N-Key lockout) and further, the code of that given key is transmitted once only for each occurrence of the above condition (2 Key Rollover).

Although such a system has been satisfactory for many purposes, it has had some drawbacks. Many data terminal operators have been trained on electric typewriters and a second key may be depressed before a first one is released. This is particularly true in high speed "Burst Rate" typing. A common example is the word "the" which the typist is so used to typing that he will type it at a higher rate than his average typing speed. N-Key lockout is not satisfactory for such transmission, as the typist must be careful to avoid burst rate typing with NKL, and this destroys the typist's normal load of operation.

SUMMARY

In accordance with the present invention, a matrix of drive wires and sense wires is provided in a two dimensional scanning matrix. The drive wires scan along one axis of the matrix and the sense wires scan along the other axis. The drive wires are sequentially pulsed by a pulse drive circuit, while the sense wires are scanned by a multiplexer circuit. A common count register operated by a clock is used to time both the drive and multiplexing circuits. Each key switch in the keyboard has a location in the matrix depending on the code assignment of the respective key switch and hence on a particular drive and sense wire selected. A saturable core type solid state switch is provided for each key.

When a key is actuated a signal will appear at the output of the multiplexer, and the output of the multiplexer is applied to a differential amplifier along with a noise signal from the keyboard. The differential amplifier output is applied to a memory, specifically a shift register, and the output of the shift register is compared with the output of the differential amplifier in an AND gate such that there is a strobe signal generated only for the first scan of a depressed key.

Function keys also are provided, and each function key provides a continuous output. Function decoder outputs are coupled to a common OR circuit, the output of which is connected to a strobe inhibit gate.

BRIEF DESCRIPTION OF THE DRAWINGS

FIG. 1 is a schematic wiring diagram of an exemplification of the invention;

FIG. 2 is a cross-section through the keyboard showing one of the keys and its relation to the sense and drive wires; and FIG. 3 is a timing diagram as it applies to the strobe generator section.

DESCRIPTION OF PREFERRED EMBODIMENTS

Referring now in greater particularity to the drawings, and first to FIG. 1, an N-Key Rollover Type Keyboard in accordance with the present invention includes a two dimensional scanning matrix 10. The matrix includes a plurality of drive wires 12 arranged along one axis of the matrix, illustrated as the vertical axis, and a plurality of sense wire 14 arranged along the other axis, illustrated as horizontal. The drive wires or lines 12 are sequentially pulsed by a pulse drive circuit 16, while the sense wires or lines 14 are scanned by a multiplexer circuit 18. Timing of both the drive and multiplexing circuits is from a common count register 20 operated by a clock 22 having a first output $\phi_1$ and a second output $\phi_2$ delayed 180° relative to $\phi_1$. The connection from the count register to the drive circuits is through a decoder 24. The register 20 is advanced with each pulse of the clock and for each advance of the register a new switch position is selected, and a new binary output code provided. Each key switch in the keyboard will have a location in the matrix depending on its code assignment, which, in turn, is determined by the particular drive and sense wire selected.

One key and its relation to the matrix will be seen in FIG. 2, and this key is generally similar to that disclosed in detail and claimed in the co-pending application of Victor M. Bernin Ser. No. 879,220 filed on Nov. 24, 1969 for solid state keyboard now U.S. Pat. No. 3,638,221.

As shown in FIG. 2 each crossover between a drive wire and a sense wire is threaded through a toroidal ferrite core 26. An inverted U-shaped steel or other magnetic member 28 has depending legs 30 and 32 respectively carrying magnets 34 and 36 which are magnetized in opposition to one another. Thus, for example, the magnet 34 may have a north pole at the left face thereof as viewed in FIG. 2 and a south pole at the right face confronting the ferrite core 26. Similarly, the magnet 36 has a north pole confronting the core 26 and a south pole at the remote face. The depending legs 30 and 32 and the interconnecting bight 38 of the inverted U-shaped member complete the magnetic circuit. The bight 38 of the U-shaped member is secured beneath a non-magnetic finger operated push button 40, such as of plastic, and a central structure 42 beneath the push button is provided with spring restoring means (not shown) for holding the button in a normally raised position illustrated above a flange 44 of the button structure which rests on a plate 46 which may be a common plate for the entire keyboard.

The magnets 34 and 36 normally hold the toroidal core 26 in magnetic saturation, and therefore no signal can be induced from the drive wire 12 to the sense wire 14. However, when the push button is depressed, the magnets move away from the toroidal core which comes out of magnetic saturation, whereby a signal on the drive wire will be inductively coupled to the sense wire threaded therewith through the toroidal core 26.

In order for the present invention to operate with a scanning system, the key must remain in a depressed condition for at least one scanning cycle. However, a scanning cycle is typically on the order of one hundred to five hundred microseconds, and it would be substantially impossible to depress a key and allow it to rise in that time. Hence, the time requirements are of no particular consequence in the operation of the keyboard.

Although the scanning system makes the operation of any key switch independent of the condition of any other key on the keyboard, the signal output of a depressed switch in this type system is inherently repeated once for each scanning cycle for as long as the switch remains in a depressed position. Obviously, only the first code generated by a depressed signal can be tolerated. Thus, all successive codes must be eliminated. Specifically, when a key is actuated, a signal will appear at the output. This pulse will appear in a time slot according to its position in the matrix, which will also correspond to the particular count or code in register 20. This pulse will trigger a storbe generator, to be discussed hereinafter, generating a single strobe pulse coincident with the correct code from the register.

Before continuing with the signal cancellation circuit and the strobe generator, it will be profitable to return briefly to the matrix 10. A typical matrix for a seven bit ASC11 code, as an example, would be a 16×8 matrix, consisting of sixteen drive lines and eight sense lines providing 128 code combination. 128 will also be recognized immediately by those skilled in the art as $2^7$, i.e., seven bits in a binary code. The drive scanning circuit consists of a 1 of 16 decoder coupled to 16 line drive amplifiers. The decoder 24 accepts a four bit address code (LSB) and the eight input multiplexer 18 accepts a three bit address code (MSB) from the count register. The multiplexer will advance one position for each 16 scans of the drive circuit.

A balance drive wire system is employed in the matrix in order to reduce cross talk (noise) interference between the drive and sense wires. A common drive return wire 50 is routed back through the drive wires in close proximity to the drive wires. The return drive current signal is equal in amplitude and opposite in phase to the drive wire signals. Cancellation of the field surrounding the drive lines therefore occurs, reducing unwanted drive signal from being coupled into the sense lines.

In order to improve the signal to noise ratio of the multiplex output signal, an additional sense line 52 is incorporated in the matrix. This line or wire is routed along the same path as the other sense wires, but is not looped through any of the ferrite cores 26. The additional or common sense line 52 will have thereon a common mode noise signal (coherent noise), and this wire 52 is connected to a difference amplifier 54 to which the output line 48 of the multiplexer is also connected. Since the noise on the line 52 will be similar to that on each of the sense wires 14, only the difference therebetween, i.e. the code signal will be amplified by the difference amplifier 54.

The output 56 of the difference amplifier 54 is applied to a summing circuit 57 the output of which is connected to a level or threshold detector 58. The threshold detector is in turn connected to a pulse stretcher 60 which has control input pulses of one phase, indicated in FIG. 3 as $\phi_1$, applied at 62 from the clock 22. The output from the pulse stretcher is taken at 64 and goes direct as at 66 to a pulse generator 67, the latter being connected to one input of a strobe inhibit gate 68.

In addition, the pulse stretcher output 64 is connected to a shift register 70 also having a control input at 72 from the clock 22 of opposite phase to that applied at 62 to the pulse stretcher, and indicated in FIG. 3 as $\phi_2$.

The keyboard pulses from the multiplexer are relatively narrow pulses (see FIG. 3, third line) and are nominally coincident with the beginning of a clock pulse. However, the shift pulses to the shift register are delayed one half clock period, viz. $\phi_2$ as compared with $\phi_1$ (lines 2 and 1 of FIG. 3). The pulse stretcher stretches the narrow input pulses (line 4 of FIG. 3) so that they can overlap the shift register advanced pulses in order that the keyboard data pulses from the multiplexer can be shifted into the register.

The output from the shift register as taken at 74 (see also bottom line of FIG. 3) is applied to an inverter 76, and the output from the inverter is connected at 78 to the strobe inhibit gate 68. Another way of looking at this is that the output from the pulse generator 67 is compared with the delayed and inverted signal pulse from the shift register in an AND gate. Thus, the first signal pulse to be generated as a result of a switch actuation will result in the generation of a strobe, since the delayed pulse is absent. However, the following signal pulse, on the next and other subsequent scanning cycles, will be inhibited by the delayed pulses from the shift register. Consequently, only one strobe pulse will be generated for a given key depression, no matter how long that particular key is held down.

As will be appreciated, the keyboard switch shown in FIG. 2 is an analog type switch, since its output signal level is proportional to the switch position. In order to make this type of switch practical, a hysteresis circuit is required. Without hysteresis, the strobing circuit would be quite susceptible to noise which could result in unstable strobing (multi-strobing). Thus, a positive feedback loop 80 is provided from the output 74 of the shift register to the input of the summing circuit 57, effectively providing the required hysteresis.

In addition to coded output signals as discussed heretofore, it is necessary for a keyboard to provide single channel continuous non-encoded or function output. The function keys are incorporated in and operated in the wiring matrix 10 in the same manner as the encoded keys. The output from such keys is generally continuous in that there is an output for each scanning cycle. The output is taken from the inverter 76 as indicated at 82 and is applied to the D input of one or more type "D" flip-flops 84. Each flip-flop 84 has an input at 86 from a decoder 88, the decoders being connected at 90 to the output of the count register 20. Each decoder generates a clock pulse for the flip-flop which is time coincident with a corresponding function signal from the multiplexer pulse. When a function key is actuated, the corresponding flip-flop will change state and will remain in this state as long as the function key is depressed. Since the flip-flop can only change state during the positive edge of the decoder pulse, a continuous output is thereby provided. The type "D" flip-flop thus provides a continuous output of high reliability at low cost as contrasted with prior art devices in which it has been necessary to rectify and filter a series of pulses with unsatisfactory results. Each of the flip-flops has an output as indicated at 92.

A strobe signal must not be generated by a function signal or during the transmission of a function signal. Accordingly, the decoder outputs 86 are all connected to an OR circuit 94, the output of which at 96 is connected to the strobe inhibit gate 68 for the purpose of inhibiting the strobe which would otherwise be generated during a function period.

Keyswitch control circuits are provided for shifting to the upper case mode or the control mode. These signals are generated similarly to a function circuit and are applied to a code translator 100 at 104 to modify the code of the count register as required to provide the correct coded output at 106. The output 98 of one of the flip-flops 84 is connected to the code translator 100, and there is also input at 102 from the count register 20. The coded output 106 is also connected at 108 to a parity generator 110 to provide a parity bit output at 112.

It will be understood that the switches or keys as discussed in connection with FIG. 2 are analog switches, but operable with digital circuits. Including analog devices in digital circuits has always been a problem, yet this type of switch is a superior switch in that it has no make-and-break contact to fail. What makes this switch operable in the present circuit is the inclusion of the hysteresis feedback loop 80. The output signal from the switch will in general contain some noise components. As the switch is depressed and its output level increases ultimately the threshold level of the threshold detected will be reached. Due to the randomness of noise the signal level will vary above and below the threshold level for a number of scanning cycles, causing multiple strobing, until the signal has increased sufficiently such that noise components cannot drop the signal level below the threshold level. With hysteresis, however, after the first triggered signal, generated by the threshold detector, the shift register output pulse will be added to the input register and instantaneously the input level is well above the threshold level such that noise can have no effect on triggering. The hysteresis feedback loop is in the nature of a gated feedback circuit, and therefore hysteresis is applied only to depressed switches. Thus, there is no affect on the other switches.

Two aspects of the matrix are worthy of special attention, namely the use of the common drive return wire parallel to and in opposition to the drive wires forming a balanced drive systems with reduced field radiation and subsequent noise and spurious signals that could cause improper operation from coupling into the sense wires. The use of the common mode signal along with the multiplexed sense wires signals coupled to a difference amplifier further lowers the noise level and helps to prevent spurious operation.

Attention also should be paid to the use of the type "D" flip-flops and associated signal decoder circuits to obtain a continuous function output.

The specific example of the invention is herein shown and described as for illustrative purposes only. Various changes will no doubt occur to those skilled in the art, and will be understood as forming a part of the present invention insofar as they fall within the spirit and scope of the appended claims.

I claim:

1. A keyboard comprising a plurality of selectively operable matrix elements each having an actuated state and an unactuated state, output means for scanning and sensing the state of each of said matrix elements in a sequential cyclic manner, memory means coupled to said output means for temporarily storing the sensed state of each of said matrix elements, said output means comprising a level detection means coupled to said matrix elements and to said memory means for ensuring the validity of said states sensed by said output means and feedback means coupled to said memory means for transmitting a feedback signal representative of the state that the matrix element being scanned was in during the previous scan cycle, said level detection means being constructed to respond to said feedback signal so as to provide a first signal level upon which said sensed state of a scanned matrix element is superimposed when said feedback signal is representative of an unactuated state of said scanned matrix element and a second signal level upon which said sensed state of a scanned matrix element is superimposed when said feedback signal is representative of an actuated state of said scanned matrix element.

2. A keyboard comprising a plurality of selectively operable matrix elements each having an actuated and an unactuated state, output means for scanning and sensing the state of each of said matrix elements in a sequential cyclic manner, memory means coupled to said output means for temporarily storing the sensed state of each of said matrix elements, output indicating means coupled to said output means for receiving a first signal representative of the sensed state of the matrix element being scanned and coupled to said memory means for receiving a second signal representative of the state that the matrix element being scanned was in during the previous scan cycle, said output indicating means being constructed to provide an output data representation only when said first signal is representative of an actuated state of said scanned matrix element and the said second signal is representative of an unactuated state of said scanned matrix element, said output means comprising a level detection means coupled to said matrix elements and to said memory means for ensuring the validity of said states sensed by said output means and feedback means coupled to said memory means for transmitting a feedback signal representative of the state that the matrix element being scanned was in during the previous scan cycle, said level detection means being constructed to respond to said feedback signal so as to provide a first signal level upon which said sensed state of a scanned matrix element is superimposed when said feedback signal is representative of an unactuated state of said scanned matrix element and a second signal level upon which said sensed state of a scanned matrix element is superimposed when said feedback signal is representative of an actuated state of said scanned matrix element.

3. A keyboard as in claim 2 wherein said second signal supplied to said output indicating means is derived from said feedback signal.

4. A keyboard comprising a matrix of actuable devices each having an actuated state and an unactuated state, means for scanning and sensing the state of each of the devices in the matrix, a storage means for temporarily storing the sensed state of each device, a comparator having one output connected to receive a first signal representative of the sensed state of a device being scanned and a second input responsive to the output of the storage means, the arrangement being such that the second input is representative of the state of said device in the preceding scan cycle whereby the comparator output is responsive only to a change of state during a scan cycle and said keyboard further comprises a level detector responsive to said first signals, the level of said first signal being changed by a predetermined amount in response to a prior scan signal from the output of the storage means indicating that, in the preceeding cycle, the device being scanned was in an actuated state.

5. A keyboard comprising a plurality of selectively operable matrix elements each having an actuated state and an unactuated state and output means for scanning and sensing the state of each of said matrix elements in a cyclic manner which operates to produce a plurality of output signals for any actuation of any one of said matrix elements and a single level detection means coupled to said output means for changing a signal level upon which said output signals are superimposed from a first level to a second level upon the occurrence of the first two output signals that are associated with any actuated matrix element, whereby valid sensing of said state of each of said matrix elements is ensured.

6. A keyboard as claimed in claim 5 wherein said second level is higher than said first level.

7. A keyboard comprising a matrix of actuable devices each having an actuated state and an unactuated state, output means for scanning and sensing the state of each of the devices in the matrix and for producing a plurality of sensed signals for each actuation of one of said matrix elements, storage means for temporarily storing the first one of said sensed signals and comparator means coupled to receive said first one of said sensed signals from said storage means and the second one of said sensed signals from said output means, said comparator means being constructed to compare said first and said second sensed signals and to produce a valid key detect indication only if said first and said second sensed signals are not identical, wherein said output means comprises level detection means responsive to said first sensed signal to vary a signal level upon which said sensed signals are superimposed.

8. A keyboard as claimed in claim 7 wherein said scanning is cyclic and said signal level is raised upon receipt of said first sensed signal from said storage means.

9. A data entry system comprising in combination:
 a. pulse generating means;
 b. a plurality of keys adapted for individual actuation, each key having a different significance in the entry of data;
 c. output means comprising a corresponding plurality of switch elements which are each connected to a respective key and are adapted to have the state of the switch modified in accordance wth the actuation of the corresponding key, for selectively transmitting pulses applied thereto;
 d. input addressing means commonly connected to said switch elements and to said pulse generating means for sequentially applying pulses to said switch elements in a predetermined order;
 e. storage means including a plurality of storage elements each respectively corresponding to a different key, coupled to said switch elements, said storage means operating in synchronism with said input addressing means for applying an output signal representative of each key to the storage element respectively corresponding thereto; and
 f. hysteresis means coupled to said storage means and to said pulse generating means and responsive to output signals from said storage means representing an actuated key for increasing the signal level of said output means in correspondence with the actuated state of a selected switch element which corresponds to a selected key, after said actuated switch element has been sequentially addressed at least a plurality of times.

10. A keyboard comprising a plurality of selectively operable matrix elements each having an actuated state and an unactuated state, output means for scanning and sensing the state of each of said matrix elements, memory means coupled to said output means for temporarily storing the sensed state of each of said matrix elements and for producing a feedback signal representing the states of respective previous scans, said output means comprising a level detection means operable for said matrix elements which controls the response of said output means as each of said matrix elements is scanned in accordance with its respective state during a previous scan, said level detection means being constructed so as to provide a first signal level upon which said sensed state of a scanned matrix element is superimposed when said feedback signal is representative of an unactuated previous state of said scanned matrix element and a second signal level upon which said sensed state of a scanned matrix element is superimposed when said feedback signal is representative of an actuated previous state of said scanned matrix element.

11. A keyboard as in claim 10 wherein said scanning is cyclic.

12. A keyboard comprising a plurality of selectively operable matrix elements each having an actuated state and an unactuated state, output means for scanning and sensing the state of each of said matrix elements, memory means coupled to said output means for temporarily storing the sensed state of each of said matrix elements, output indicating means coupled to said output means for receiving a first signal representative of the sensed state of the matrix element being scanned and coupled to said memory means for receiving a second signal representative of the state that the matrix element being scanned was in during the previous scan cycle, said output indicating means being constructed to provide an output data representation only when said first signal is representative of an actuated state of said scanned matrix element and the second signal is representative of an unactuated state of said scanned matrix element, said output means comprising a level detection means operable for said matrix elements which controls the response of said output means as each of said matrix elements is scanned and prior scan means coupled to said memory means for transmitting a prior scan signal representative of the state that the matrix element being scanned was in during the previous scan cycle, said level detection means being constructed to respond to said prior scan signal so as to provide a first signal level upon which said sensed state of a scanned matrix element is superimposed when said prior scan signal is representative of an unactuated state of said scanned matrix element and a second signal level upon which said sensed state of a scanned matrix element is superimposed when said prior scan signal is representative of an actuated state of said scanned matrix element.

13. A keyboard as in claim 12 wherein said scanning is cyclic and said second signal supplied to said output means is derived from said prior scan signal.

14. A keyboard as in claim 13 wherein said second signal is the logical inverse of said prior scan signal.

15. A keyboard comprising signal encoding means comprising a plurality of selectively operable matrix elements each having an actuated state and an unactuated state and selection means for interrogating and sensing the state of each of said matrix elements, said selection means operating to produce a plurality of output signals for any actuation of any one of said matrix elements and a single control means coupled to said selection means and to said signal encoding means which changes the signal levels of said respective states of said signal encoding means upon the occurrence of two consecutive output signals that are associated with any actuated matrix element.

16. A data entry system comprising in combination:
 a. pulse generating means;
 b. a plurality of keys adapted for individual actuation, each key having a different significance in the entry of data;
 c. output means comprising a corresponding plurality of switch elements, each connected to a respective key and adapted to have the state of the switch modified in accordance with the actuation of the corresponding key, for selectively transmitting pulses applied thereto;
 d. input addressing means commonly connected to said switch elements and to said pulse generating means for sequentially applying pulses to said switch elements in a predetermined order; and
 e. storage means, including a plurality of storage elements each respectively corresponding to a different key, coupled to said switch elements, said storage means operating in synchronism with said input addressing means for applying an output signal representative of each key to the storage element respectively corresponding thereto; and
 f. hysteresis means for varying the effective output signal level representative of each key that has been actuated and then sequentially addressed at least a plurality of times.

17. A keyboard comprising a plurality of selectively operable matrix elements each having an actuated state and an unactuated state, output means for scanning and sensing the state of each of said matrix elements, memory means coupled to said output means for temporarily storing the sensed state of each of said matrix elements, said output means comprising a level detection means coupled to said matrix elements and to said memory means for comparison of the sensed state of each of said matrix elements to a threshold level and for producing an output representative of each of said comparisons, and hysteresis means coupled to said memory means for transmitting a feedback signal representative of the state that the matrix element being scanned was in during the previous scan cycle, said level detection means being constructed to respond to said feedback signal so as to vary the relative levels of each of said sensed states and its respective corresponding threshold level in response to the state that the matrix element being scanned was in during the previous scan cycle.

18. A keyboard comprising a plurality of selectively operable matrix elements each having an actuated state and an unactuated state, output means for scanning and sensing the state of each of said matrix elements, memory means coupled to said output means for temporarily storing the sensed state of each of said matrix elements, said output means comprising a level detection means coupled to said matrix elements and to said memory means for comparison of the sensed state of each of said matrix elements to a threshold level and for producing an output signal representative of each of said comparisons and hysteresis means coupled to said memory means for transmitting a hysteresis signal representative of the state that the matrix element being scanned was in during the previous scan cycle, said level detection means being constructed in a manner whereby at least one of said sensed state of each of said matrix elements or its respective corresponding threshold level is varied in response to said hysteresis signal.

* * * * *